United States Patent
Wada

(10) Patent No.: US 9,368,354 B2
(45) Date of Patent: Jun. 14, 2016

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventor: Masahiro Wada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/588,499

(22) Filed: Jan. 2, 2015

(65) Prior Publication Data

US 2015/0194519 A1    Jul. 9, 2015

(30) Foreign Application Priority Data

Jan. 8, 2014   (JP) .................. 2014-001826

(51) Int. Cl.

| | |
|---|---|
| *H01L 29/788* | (2006.01) |
| *H01L 21/265* | (2006.01) |
| *H01L 29/36* | (2006.01) |
| *H01L 21/28* | (2006.01) |
| *H01L 29/66* | (2006.01) |
| *H01L 29/423* | (2006.01) |
| *H01L 27/115* | (2006.01) |

(52) U.S. Cl.
CPC ........ *H01L 21/265* (2013.01); *H01L 21/26586* (2013.01); *H01L 21/28273* (2013.01); *H01L 27/11521* (2013.01); *H01L 27/11534* (2013.01); *H01L 29/42328* (2013.01); *H01L 29/66825* (2013.01); *H01L 29/7881* (2013.01)

(58) Field of Classification Search
CPC ............ H01L 21/265; H01L 21/26586; H01L 21/28273; H01L 27/11521; H01L 27/11534; H01L 29/42328; H01L 29/66825; H01L 29/7881

See application file for complete search history.

(56) References Cited

U.S. PATENT DOCUMENTS

| | | | |
|---|---|---|---|
| 2009/0039410 A1 | 2/2009 | Liu et al. | |
| 2012/0181607 A1* | 7/2012 | Ryu | ................... H01L 21/28273 257/337 |
| 2014/0175533 A1* | 6/2014 | Kwon | ............... H01L 21/28282 257/324 |

FOREIGN PATENT DOCUMENTS

JP    2009-044164 A    2/2009

* cited by examiner

*Primary Examiner* — Whitney T Moore
(74) *Attorney, Agent, or Firm* — Sughrue Mion, PLLC

(57) ABSTRACT

To improve the reliability of a semiconductor device. In particular, the reading of incorrect information from a memory cell is suppressed. A first low-concentration region is formed in a well, and is located under a side wall insulating film in a planar view. The first low-concentration region has a second conductivity type, and the second conductivity-type impurity concentration is lower than the impurity concentration in a drain. A second low-concentration region is formed in the well, and is located under a spacer insulating film in a planar view. In addition, a second conductivity type impurity concentration in the second low-concentration region is lower than the second conductivity-type impurity concentration in the first low-concentration region, and is higher than the second conductivity-type impurity concentration in a portion located under the insulating film of the well.

11 Claims, 14 Drawing Sheets

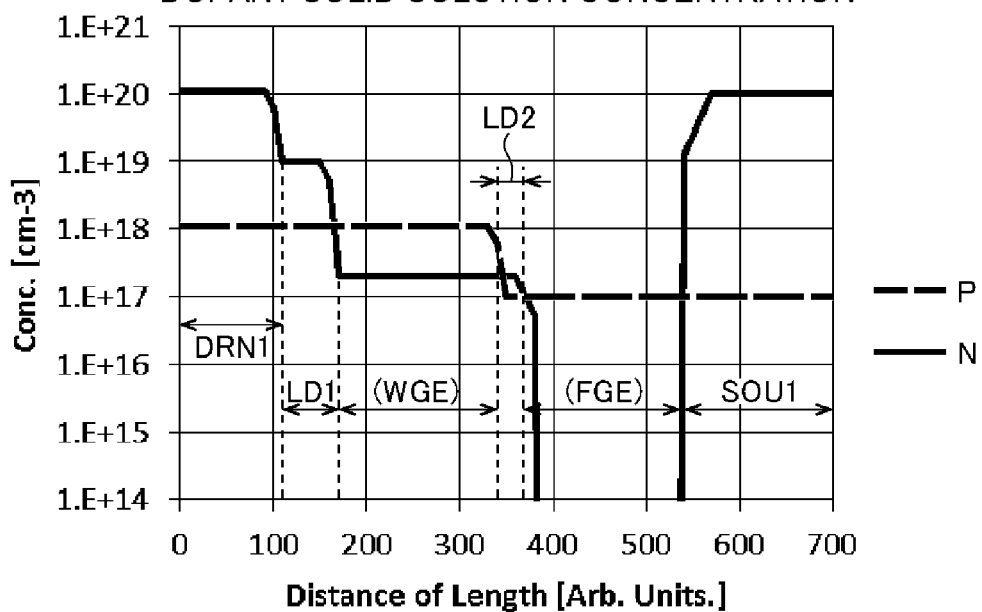

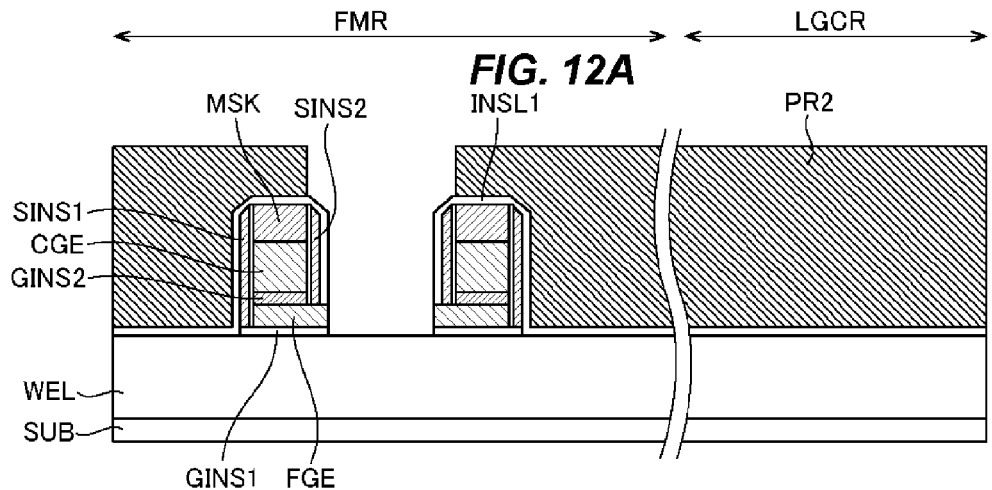
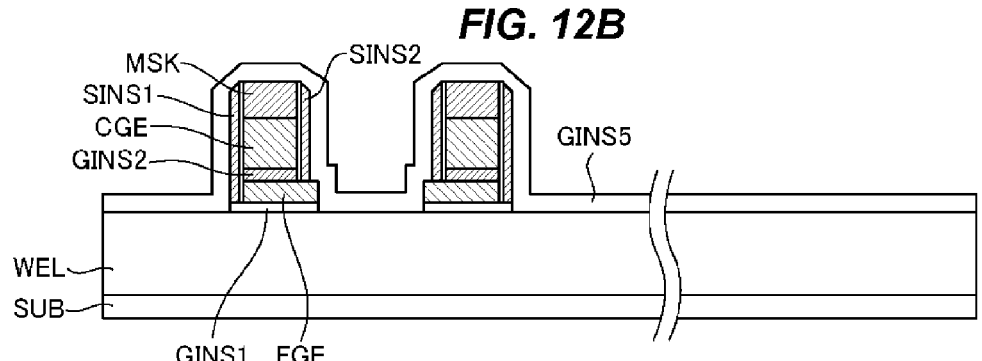
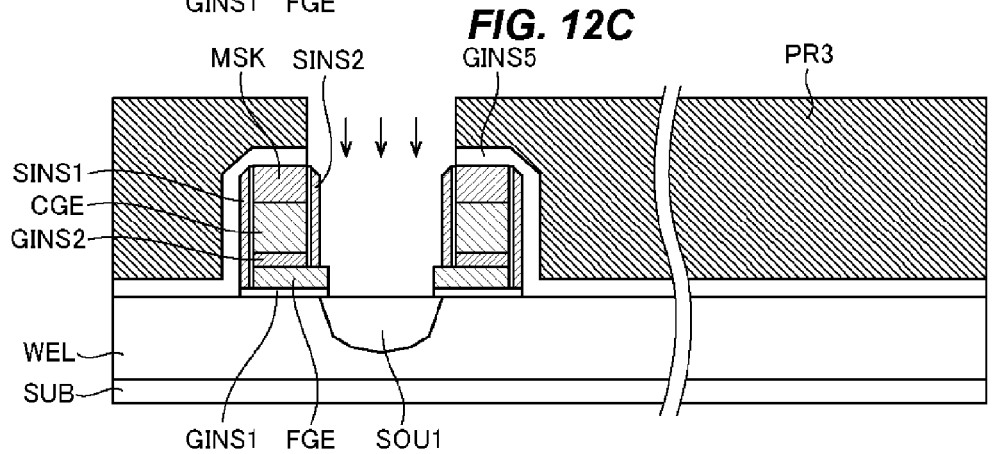
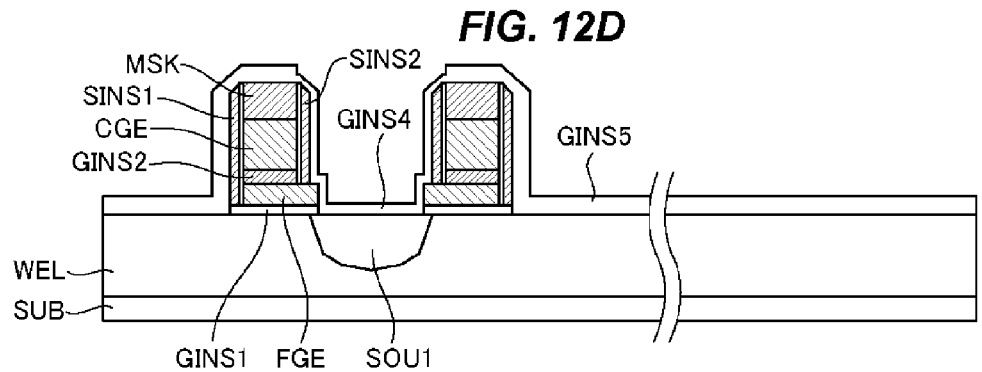

SEMICONDUCTOR DEVICE AND METHOD OF MANUFACTURING THE SAME

CROSS-REFERENCE TO RELATED APPLICATION

The disclosure of Japanese Patent Application No. 2014-001826 filed on Jan. 8, 2014 including the specification, drawings and abstract is incorporated herein by reference in its entirety.

BACKGROUND

The present invention relates to a semiconductor device and a method of manufacturing the same, and for example, relates to a technique applicable to a semiconductor device having a nonvolatile memory and a method of manufacturing the same.

One example of a nonvolatile memory is a split-gate-type nonvolatile memory (for example, see Japanese Patent Laid-Open No. 2009-44164). In this type of nonvolatile memory, a selection gate electrode is in contact with a floating gate electrode and a control gate electrode via a spacer insulating film.

SUMMARY

A spacer insulating film is usually formed by an etch back method. Therefore, variations in the film thickness of the spacer insulating film due to manufacturing are generated. In addition, when the thickness of the spacer insulating film becomes larger than a design value to some extent, the distance between a selection gate electrode and a control gate electrode increases. Therefore, even if a specified voltage is applied to the selection gate electrode and the control gate electrode, respectively, a current may not flow between a drain and a source. In this case, incorrect information is read from a memory cell. The main subject of the present application is to improve the reliability of a nonvolatile memory, in particular, to suppress the reading of incorrect information from a memory cell. The other subjects and new features of the present invention will become clear from the description of the present specification and the accompanying drawings.

According to an embodiment, a floating gate electrode is formed over a first insulating film. A spacer insulating film covers a first side wall on two side surfaces of the floating gate electrode. A selection gate electrode faces the floating gate electrode via the spacer insulating film. A side wall insulating film is formed on a side surface opposite to the spacer insulating film of the selection gate electrode. A first low-concentration region is formed in a well, and is located under the side wall insulating film in a planar view. The first low-concentration region has a second conductivity type, and the second conductivity-type impurity concentration is lower than the impurity concentration in the drain. A second low-concentration region is formed in the well, and is located under the spacer insulating film in a planar view. In addition, the second conductivity-type impurity concentration in the second low-concentration region is lower than the second conductivity-type impurity concentration in the first low-concentration region and is higher than the second conductivity-type impurity concentration in a portion located under the first insulating film of the wells.

According to the embodiment, the reliability of the nonvolatile memory cell can be improved.

BRIEF DESCRIPTION OF THE DRAWINGS

FIG. 3 illustrates a second example of the profile of the impurity concentration in the A-A' cross-section of FIG. 1;

FIGS. 12A-12D are cross-sectional views illustrating the method of manufacturing the semiconductor device according to the third embodiment;

DETAILED DESCRIPTION

Hereinafter, several embodiments will be described with reference to the accompanying drawings. Meanwhile, the same symbol is attached to the same member, and the explanation thereof is omitted as required.

First Embodiment

Figure 1:
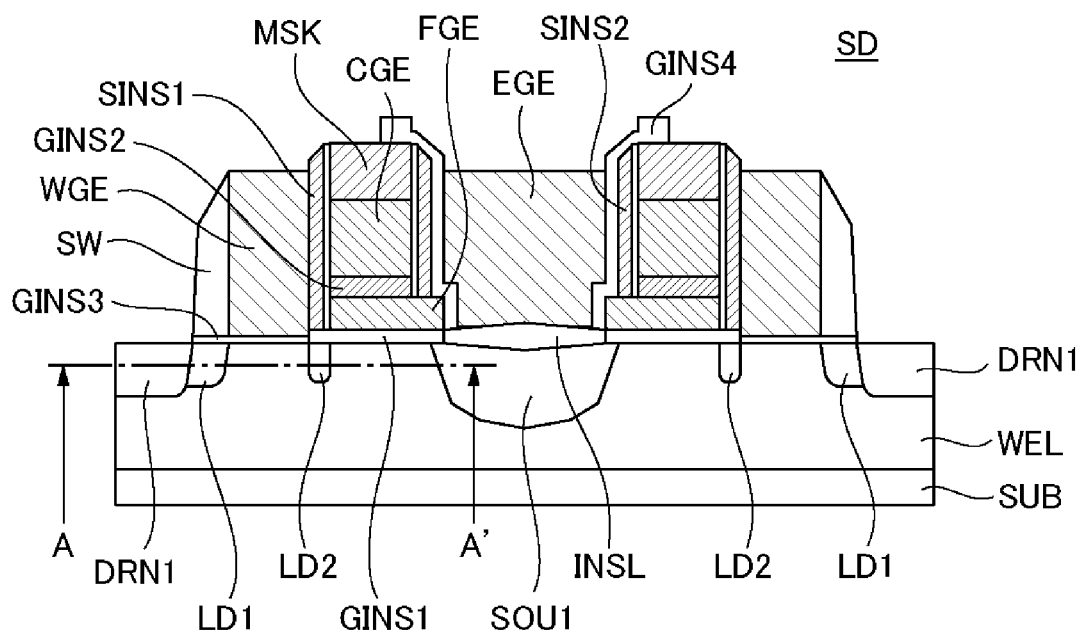
FIG. 1 is a cross-sectional view illustrating the configuration of a semiconductor device according to a first embodiment.

FIG. 1 is a cross-sectional view illustrating the configuration of a semiconductor device SD according to a first embodiment. The semiconductor device SD according to the present embodiment has a nonvolatile memory. Specifically, the semiconductor device SD includes a substrate SUB, an insulating film GINS1 (a first insulating film GINS1), a floating gate electrode FGE, a spacer insulating film SINS1, a selection gate electrode WGE, a side wall insulating film SW, a drain DRN1 (a first second-conductivity-type region), a source SOU1 (a second second-conductivity-type region), a first low-concentration region LD1, and a second low-concentration region LD2.

A well WEL is a first conductivity type and is formed in the substrate SUB. The insulating film GINS1 is formed in a region, in which the well WEL is formed, of the substrate SUB. The insulating film GINS1 is formed on the surface of the substrate SUB, for example. The floating gate electrode FGE is formed over the insulating film GINS1. The spacer insulating film SINS1 covers one (a first side wall) of two side surfaces of the floating gate electrode FGE. The selection gate electrode WGE faces the floating gate electrode FGE via the spacer insulating film SINS1. The side wall insulating film SW is formed on a side surface opposite to the spacer insulating film SINS1 of the selection gate electrode WGE.

The drain DRN1 is formed in the well WEL, and is located opposite to the floating gate electrode FGE via the side wall insulating film SW in a planar view. The source SOU1 is formed in the well WEL, and is located opposite to the drain DRN1 via the floating gate electrode FGE. The drain DRN1 and the source SOU1 have a second conductivity type.

The first low-concentration region LD1 is formed in the well WEL, and is located under the side wall insulating film SW in a planar view. The first low-concentration region LD1 has the second conductivity type, and the second conductivity-type impurity concentration in the first low-concentration region LD1 is lower than the second conductivity-type impurity concentration in the drain DRN1. The second low-concentration region LD2 is formed in the well WEL, and is located under the spacer insulating film SINS1 in a planar view. In addition, the second conductivity-type impurity concentration in the second low-concentration region LD2 is lower than the second conductivity-type impurity concentration in the first low-concentration region LD1, and is higher than the second conductivity-type impurity concentration in a portion located under the insulating film of the well WEL.

Hereinafter, the semiconductor device SD will be described in detail assuming that the first conductivity type is a p-type and the second conductivity type is an n-type. However, the first conductivity type may be an n-type and the second conductivity type may be a p-type.

The substrate SUB is, for example, a semiconductor substrate such as a silicon substrate. The well WEL is formed by, for example, implanting a p-type impurity ion into the substrate SUB. However, when the substrate SUB is a p-type substrate, the substrate SUB itself may serve as the well WEL. Furthermore, the well WEL may contain an n-type impurity. However, in this case, the n-type impurity concentration is lower than the p-type impurity concentration.

In the example illustrated in this figure, the semiconductor device SD includes a plurality of split-gate type nonvolatile memories. The nonvolatile memory shares the source SOU1 with other nonvolatile memory. In other words, two nonvolatile memories have an axisymmetric configuration with reference to the source SOU1.

The nonvolatile memory has a stacked structure in which the floating gate electrode FGE, the insulating film GINS2, and the control gate electrode CGE are stacked, in this order, over the insulating film GINS1. The insulating film GINS1 is, for example, a silicon oxide film, and is formed by, for example, thermally oxidizing the substrate SUB. The floating gate electrode FGE and the control gate electrode CGE are formed of, for example, a polysilicon film. Furthermore, the insulating film GINS2 is formed of a film (ONO film) in which, for example, a silicon oxide film, a silicon nitride film, and a silicon oxide film are stacked in this order. Moreover, a mask film MSK is formed over the control gate electrode CGE. The mask film MSK is a hard mask film, and is formed of an insulating film such as a silicon nitride film. The mask film MSK is a mask film that is used when the control gate electrode CGE is formed.

In the example illustrated in this figure, two stacked structures are arranged at locations facing each other. In addition, an erase gate electrode EGE is formed between two stacked structures. Both the above-described two stacked structures face the erase gate electrode EGE via the spacer insulating film SINS2. Furthermore, an insulating film INSL is formed between the erase gate electrode EGE and the substrate SUB. The insulating film INSL is, for example, a silicon oxide film and the film thickness thereof is thicker than the insulating film GINS1. Moreover, the insulating film INSL is formed by thermally oxidizing the substrate SUB. Then, in a region located under the erase gate electrode EGE of the well WEL, an $n^+$-type source SOU1 is formed.

On a side surface opposite to the erase gate electrode EGE of the above-described stacked structure, the spacer insulating film SINS1 is formed. In addition, on a side surface opposite to the above-described stacked structure of the spacer insulating film SINS1, the selection gate electrode WGE is formed. Between the selection gate electrode WGE and the substrate SUB, a gate insulating film GINS3 is formed. The gate insulating film GINS3 is, for example, a silicon oxide film and the film thickness thereof is smaller than that of the insulating film GINS1. Furthermore, the insulating film GINS3 is formed by thermally oxidizing the substrate SUB.

On a side surface opposite to the spacer insulating film SINS1 of the selection gate electrode WGE, the side wall insulating film SW is formed. The side wall insulating film SW is formed, for example, of a silicon oxide film.

In addition, in a region opposite to the selection gate electrode WGE with reference to the side wall insulating film SW in a planar view, of the well WEL, an $n^+$-type drain DRN1 is formed. Furthermore, in a region located below the side wall insulating film SW of the well WEL, an n-type first low-concentration region LD1 is formed. The p-type impurity concentration in the first low-concentration region LD1 is higher than the p-type impurity concentration in the well WEL.

Moreover, the second low-concentration region LD2 is formed in a region located below the spacer insulating film SINS1 of the well WEL. As described above, the n-type impurity concentration in the second low-concentration region LD2 is lower than the n-type impurity concentration in the first low-concentration region LD1, and is higher than the n-type impurity concentration in a portion located under the spacer insulating film SINS1 of the well WEL. In the second low-concentration region LD2, the n-type impurity concentration may be lower than the p-type impurity concentration or may be higher than the p-type impurity concentration. In the former case, the second low-concentration region LD2 serves as a p-type region having an impurity concentration lower than the well WEL, whereas in the latter case, the second low-concentration region LD2 serves as an n-type region having an impurity concentration lower than the first low-concentration region LD1. Meanwhile, the p-type impurity concentration in the second low-concentration region LD2 may be higher than the p-type impurity concentration in a region located below the spacer insulating film SINS1 of the well WEL or may be substantially the same.

Note that the spacer insulating film SINS2 has a structure in which, for example, a silicon oxide film is stacked over a silicon nitride film. Among these, the silicon nitride film covers the side walls of the mask film MSK, control gate electrode CGE, and insulating film GINS2, but does not cover the side walls of the floating gate electrode FGE and insulating film GINS1. On the other hand, the silicon oxide film covers the side walls of the mask film MSK, control gate electrode CGE, and insulating film GINS2, floating gate electrode FGE, and insulating film GINS1.

Furthermore, the spacer insulating film SINS1 has a structure in which a silicon nitride film is stacked over a silicon oxide film. However, both the silicon oxide film and silicon nitride film of the spacer insulating film SINS1 cover the side walls of the mask film MSK, control gate electrode CGE, and insulating film GINS2, floating gate electrode FGE, and insulating film GINS1.

Moreover, the insulating film GINS2, the control gate electrode CGE, and the mask film MSK do not cover an edge on the erase gate electrode EGE side of the floating gate electrodes FGE.

In addition, a tunnel insulating film GINS4 (insulating film GINS4) is formed between the floating gate electrode FGE and the erase gate electrode EGE. The insulating film GINS4 serves as a route for electric charges when the information written in the floating gate electrode FGE is deleted. Meanwhile, the insulating film GINS4 is also formed over the spacer insulating film SINS2 and on the mask film MSK.

In such a semiconductor device SD, the writing of information into the nonvolatile memory is performed by injecting a hot electron into the floating gate electrode FGE by source side injection. That is, a voltage (e.g., 4.5 V) is applied to the source SOU1, a voltage (e.g., 2 V) lower than the voltage of the source SOU1 is applied to the selection gate electrode WGE, the drain DRN1 is set to a voltage (e.g., 0.5 V) lower than the voltage applied to the selection gate electrode WGE, and then a voltage (e.g., 10 V) higher than the voltage of the source SOU1 is applied to the control gate electrode CGE. On the other hand, the information is deleted from the nonvolatile memory by extracting electrons from the floating gate electrode FGE into the erase gate by FN tunneling. That is, a voltage (e.g., 12 V) is applied to the erase gate electrode EGE, and the remaining electrodes (drain DRN1, source SOU1, control gate electrode CGE, and selection gate electrode WGE) are set to 0 V.

Figure 2:
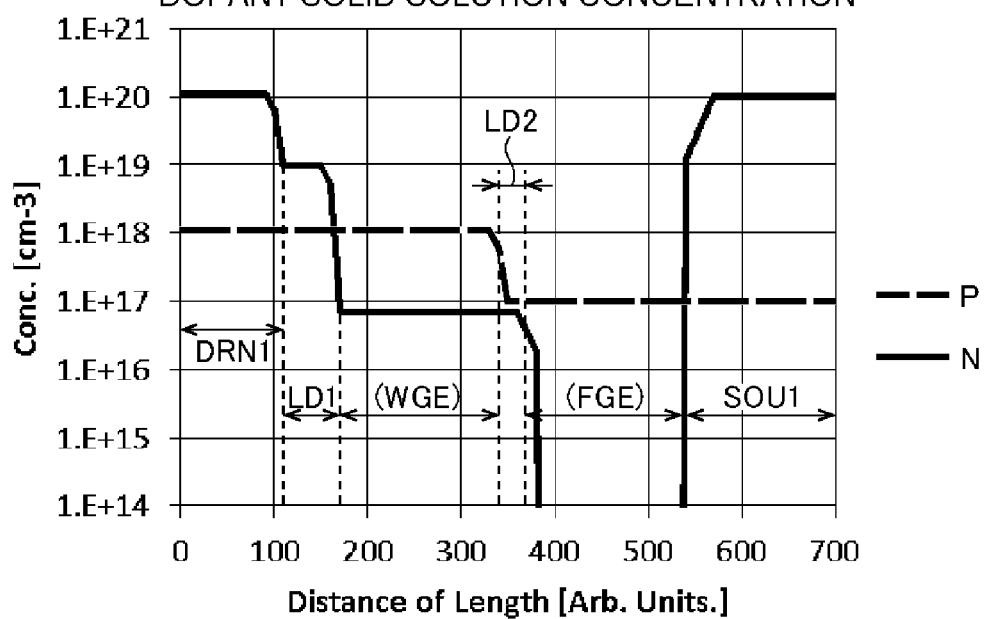
FIG. 2 illustrates a first example of the profile of the impurity concentration in an A-A' cross-section of FIG. 1.

FIG. 2 illustrates a first example of the profile of the impurity concentration in an A-A' cross-section of FIG. 1. In the example illustrated in this figure, the second low-concentration region LD2 is a p-type impurity region.

Specifically, the p-type impurity concentration in the drain DRN1, the first low-concentration region LD1, and a portion located below the selection gate electrode WGE of the well WEL is slightly higher than the p-type impurity concentration in other regions (for example, the source SOU1 and a portion located below the floating gate electrode FGE of the well WEL). For example, the p-type impurity concentration in the source SOU1 and in a portion located below the floating gate electrode FGE of the well WEL is $5\times10^{16}$ cm$^{-3}$ or more and $5\times10^{17}$ cm$^{-3}$ or less. On the other hand, in the drain DRN1, the first low-concentration region LD1, and a portion located below the selection gate electrode WGE of the well WEL, the p-type impurity concentration is $5\times10^{17}$ cm$^{-3}$ or more and $5\times10^{18}$ cm$^{-3}$ or less.

Furthermore, the n-type impurity concentration is the highest in the drain DRN1 and the source SOU1, is the next highest in the first low-concentration region LD1, and is the next highest in a portion located below the selection gate electrode WGE of the well WEL and in the second low-concentration region LD2. Moreover, in a portion located below the floating gate electrode FGE of the well WEL, the n-type impurity concentration is below measurable limits.

In addition, in a portion located below the selection gate electrode WGE of the well WEL and in the second low-concentration region LD2, the n-type impurity concentration is lower than the p-type impurity concentration. On the other hand, in the first low-concentration region LD1, the n-type impurity concentration is higher than the p-type impurity concentration. For example, the n-type impurity concentration in the drain DRN1 and the source SOU1 is $5\times10^{19}$ cm$^{-3}$ or more and $5\times10^{20}$ cm$^{-3}$ or less. Furthermore, the n-type impurity concentration in a portion located below the selection gate electrode WGE of the well WEL is $5\times10^{18}$ cm$^{-3}$ or more and $5\times10^{19}$ cm$^{-3}$ or less. On the other hand, the n-type impurity concentration in a portion located below the selection gate electrode WGE of the well WEL and in the second low-concentration region LD2 is $5\times10^{16}$ cm$^{-3}$ or more and $5\times10^{17}$ cm$^{-3}$ or less.

In addition, the p-type impurity effective concentration (that is, the difference between the p-type impurity concentration and the n-type impurity concentration) in the second low-concentration region LD2 is lower than the p-type impurity effective concentration in a portion located below the floating gate electrode FGE of the well WEL.

Furthermore, the n-type impurity concentration in the second low-concentration region LD2 decreases as it approaches the floating gate electrode FGE in a planar view. This is because the n-type impurity of the second low-concentration region LD2 is ion-implanted from a diagonal direction after the spacer insulating film SINS1 is formed, as described later.

FIG. 3 illustrates a second example of the profile of the impurity concentration in the A-A' cross-section of FIG. 1. The example illustrated in this figure is the same as the example illustrated in FIG. 2 except that in the second low-concentration region LD2, the n-type impurity concentration is higher than the p-type impurity concentration. Therefore, the second low-concentration region LD2 serves as an n-type impurity region. However, the n-type impurity effective concentration (that is, difference between the n-type impurity concentration and the p-type impurity concentration) in the second low-concentration region LD2 is lower than the n-type impurity effective concentration in the first low-concentration region LD1.

FIG. 4 to FIG. 7 are cross-sectional views illustrating an example of a method of manufacturing the semiconductor device SD illustrated in FIG. 1. An outline of the processes illustrated in this figure is as follows. First, the well WEL is formed on the substrate SUB. Next, the insulating film GINS1 and the floating gate electrode FGE are formed in a region, in which the well WEL is formed, of the substrate SUB. Next, the spacer insulating film SINS1 is formed in the floating gate electrode FGE. Then, the second low-concentration region LD2 (low concentration region) is formed by implanting an n-type impurity ion into the well from a diagonal direction. In this process, the second low-concentration region LD2 is formed in a portion located below the spacer insulating film SINS1 of the well WEL and also in a region not covered with the floating gate electrode FGE. After that, a p-type impurity ion is implanted into a region not covered with the spacer insulating film SINS1 of the second low-concentration region LD2. Next, the selection gate electrode WGE is formed and further the drain DRN1 and the source SOU1 are formed. Meanwhile an element isolating film (not illustrated) is formed on the substrate SUB at the right timing. This element isolating film has, for example, an STI structure. Hereinafter, the detailed explanation will be made.

Figure 4A:
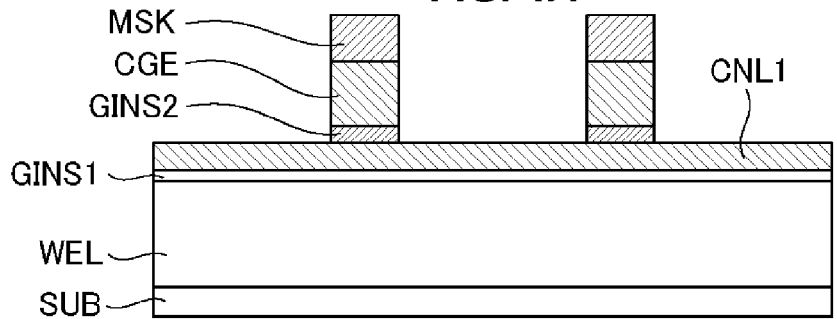
FIGS. 4A-4D are cross-sectional views illustrating an example of a method of manufacturing the semiconductor device illustrated in FIG. 1.

First, a p-type impurity ion is implanted into the substrate SUB as illustrated in FIG. 4A. Therefore, the well WEL is formed on the substrate SUB. Next, the insulating film GINS1 is formed by thermally oxidizing the substrate SUB. The insulating film GINS1 is formed in a region, in which the element isolating film is not formed, of the substrate SUB. Subsequently, a conductive film CNL1 is formed over the insulating film GINS1. The conductive film CNL1 is, for example, a polysilicon film, and is formed using, for example, a plasma CVD method.

Then, an insulating film serving as the insulating film GINS2, a conductive film serving as the control gate electrode CGE, and the mask film MSK are formed in this order over the conductive film CNL1. These films are formed using for example, a plasma CVD method. After that, a resist pattern (not illustrated) is formed over the mask film MSK, and the mask film MSK is selectively etched with this resist pattern as a mask. Therefore, an opening pattern is formed in the mask film MSK. Next, etching with the mask film MSK as a mask is performed. Therefore, the control gate electrode CGE and the insulating film GINS2 are formed. Meanwhile, in etching when the control gate electrode CGE is formed, the insulating film GINS2 functions as an etching stopper. Furthermore, when the insulating film GINS2 is etched, the conductive film CNL1 functions as an etching stopper.

Figure 4B:
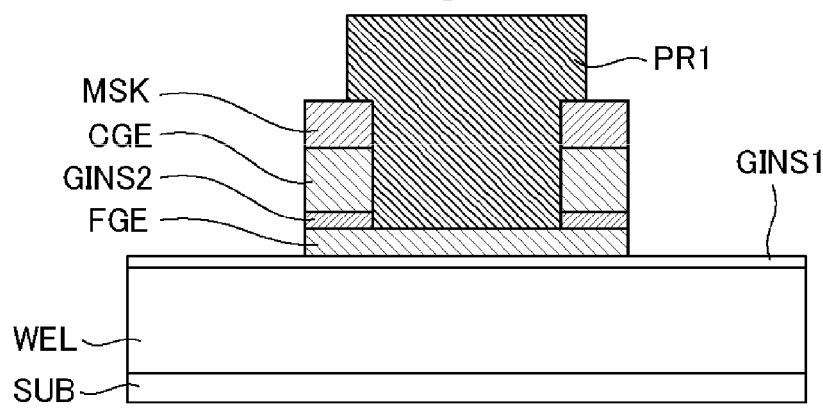

Next, as illustrated in FIG. 4B, the region (i.e., region in which the erase gate electrode EGE is formed) located between the adjacent control gate electrodes CGE of the conductive film CNL1 is covered with the resist pattern PR1. Subsequently, the conductive film CNL1 is etched with the resist pattern PR1 as a mask. Therefore, the floating gate electrode FGE is formed. In this etching, the insulating film GINS1 serves as an etching stopper. Meanwhile, in the state illustrated in this figure, the adjacent two floating gate electrodes FGE are in a state of being coupled to each other.

Figure 4C:
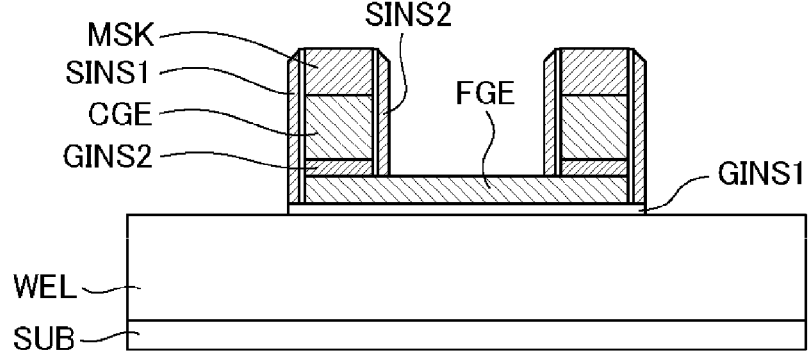
Figure 4D:
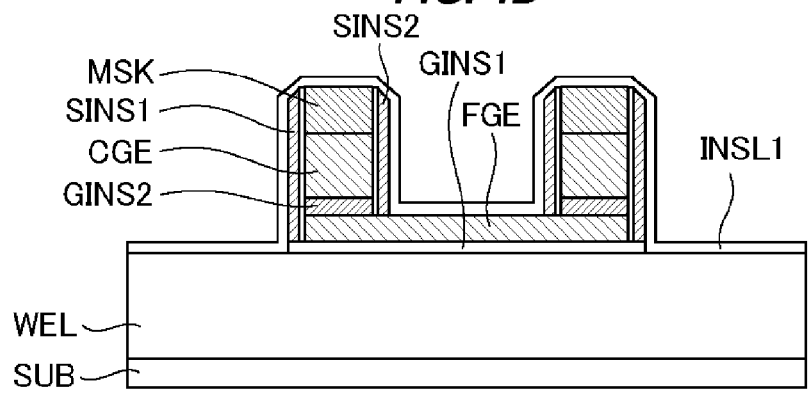

Next, as illustrated in FIG. 4C, the resist pattern PR1 is removed. Next, an insulating film serving as the spacer insulating films SINS1 and SINS2 is formed over the entire surfaces including over the side surface of the mask film MSK, over the side surface of the control gate electrode CGE, over the side surface of the insulating film GINS2, over the floating gate electrode FGE, and over the insulating film GINS1. In the example illustrated in this figure, this insulating film has a stacked structure of a silicon oxide film and a silicon nitride film, for example. Next, this insulating film is etched back. Therefore, the spacer insulating films SINS1 and SINS2 are formed.

Subsequently, as illustrated in FIG. 4C, the insulating film INSL1 is formed over the entire surface including over the spacer insulating films SINS1 and SINS2. The insulating film INSL1 is, for example, a silicon oxide film.

Figure 5A:
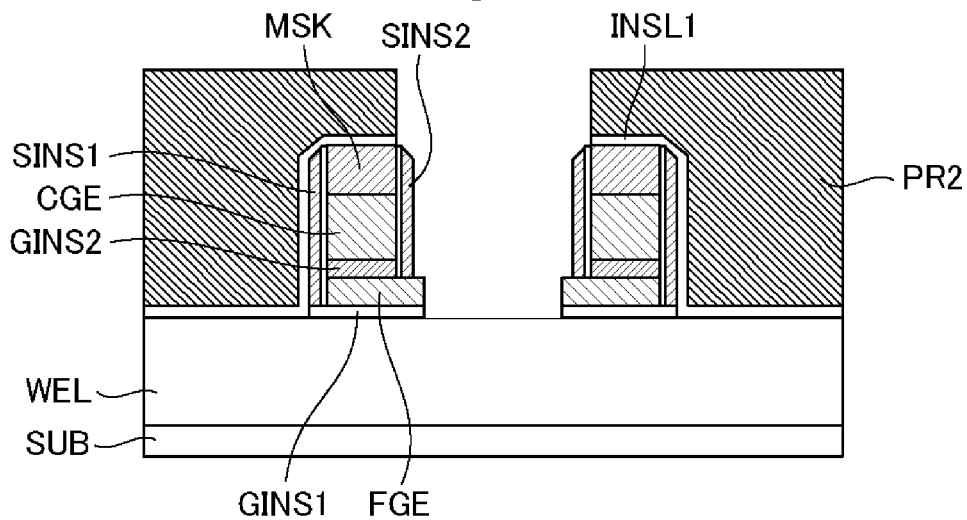
FIGS. 5A-5C are cross-sectional views illustrating an example of the method of manufacturing the semiconductor device illustrated in FIG. 1.

Then, as illustrated in FIG. 5A, a resist pattern PR2 is formed. The resist pattern PR2 covers a region, in which the drain DRN1 is to be formed, of the substrate SUB, but has an opening in a region in which the source SOU1 is to be formed. After that, with the resist pattern PR2 and the insulating film INSL1 as a mask, the insulating film INSL1, the floating gate electrode FGE, and the insulating film GINS1 are etched. Therefore, a portion located in a region, in which the source SOU1 is to be formed, of the insulating film INSL1, the floating gate electrode FGE, and the insulating film GINS1 is removed.

Figure 5B:
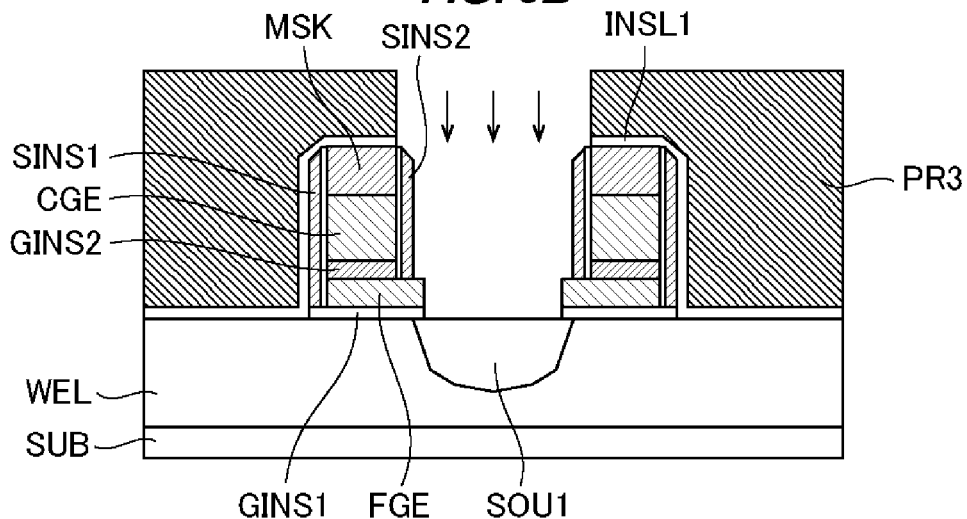

Next, as illustrated in FIG. 5B, a resist pattern PR3 is formed. The resist pattern PR3 covers a region, in which the drain DRN1 is to be formed, of the substrate SUB, but has an opening in a region in which the source SOU1 is to be formed. Subsequently, with the resist pattern PR3 as a mask, an n-type impurity ion is implanted into the substrate SUB. Therefore, the source SOU1 is formed in the substrate SUB.

Figure 5C:
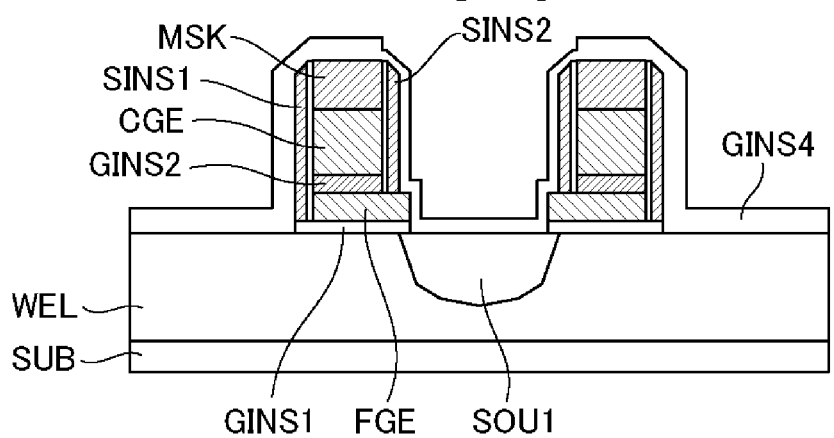

After that, as illustrated in FIG. 5C, the resist pattern PR3 is removed. Then, over the side surface on a side, in which the erase gate electrode EGE is to be formed, of the floating gate electrodes FGE, the insulating film GINS4 is formed as the tunnel insulating film. In this process, the insulating film GINS4 is formed over the mask film MSK1, over the spacer insulating films SINS1 and SINS2, and over the substrate SUB.

Figure 6A:
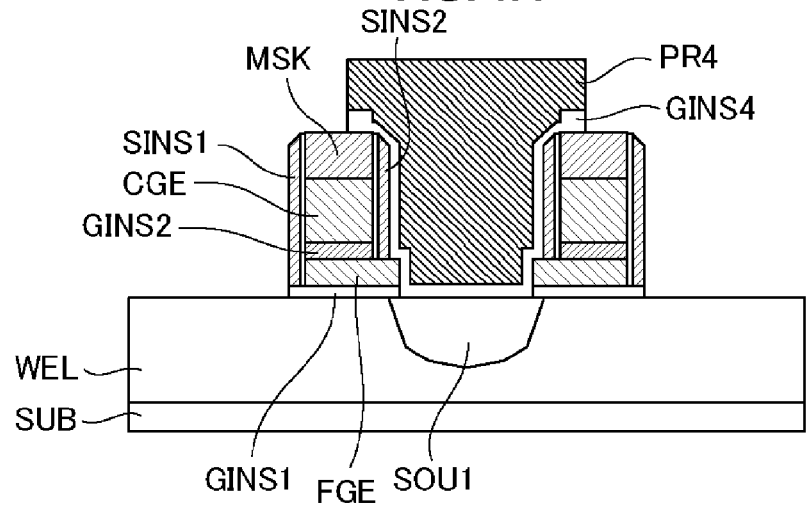
FIGS. 6A-6C are cross-sectional views illustrating an example of the method of manufacturing the semiconductor device illustrated in FIG. 1.

Next, as illustrated in FIG. 6A, a resist pattern PR4 is formed. Subsequently, the insulating film GINS4 is etched with the resist pattern PR4 as a mask. Therefore, the insulating film GINS4 is removed except over the spacer insulating film SINS2, over the side surfaces of two floating gate electrodes FGE, and except a portion located between two floating gate electrodes FGE of the substrate SUB. Meanwhile, the insulating film GINS4 may remain also at an edge on the spacer insulating film SINS2 side of the upper surface of the mask film MSK.

Meanwhile, a process of forming the second low-concentration region LD2 and a process of implanting an p-type impurity from a vertical direction to be described with reference to FIG. 6B and FIG. 6C may be performed before removing the insulating film GINS4. That is, these two processes may be performed in the state of FIG. 5C. In this case, the insulating film GINS4 is removed after these processes, and subsequently the insulating film GINS3 and the insulating film INSL are formed by thermally oxidizing the substrate SUB.

Figure 6B:
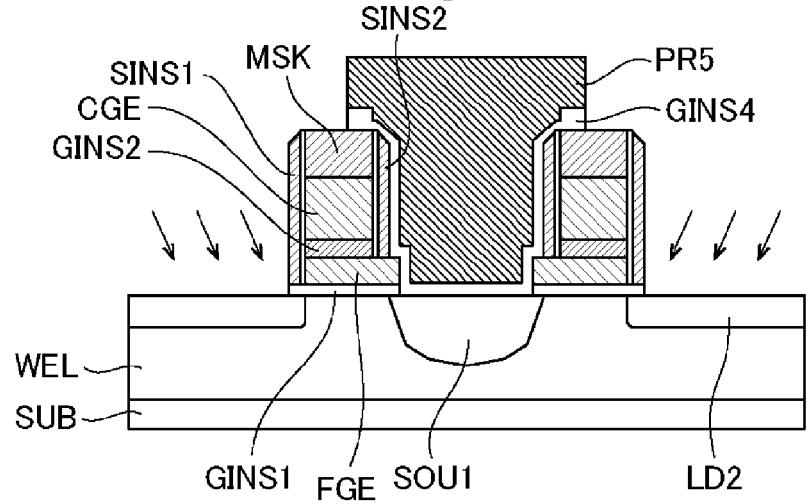

Then, as illustrated in FIG. 6B, the resist pattern PR4 is removed. After that, a resist pattern PR5 is formed. The resist pattern PR5 covers a region located between two floating gate electrodes FGE of the substrate SUB. Next, an n-type impurity ion is implanted into the substrate SUB from a diagonal direction while rotating the substrate SUB. Therefore, the second low-concentration region LD2 is formed in a portion located below the spacer insulating film SINS1 of the substrate SUB and in a portion not covered with the floating gate electrode FGE and the resist pattern PR5. Meanwhile a detailed example of the ion implantation conditions at this time will be described later.

Figure 6C:
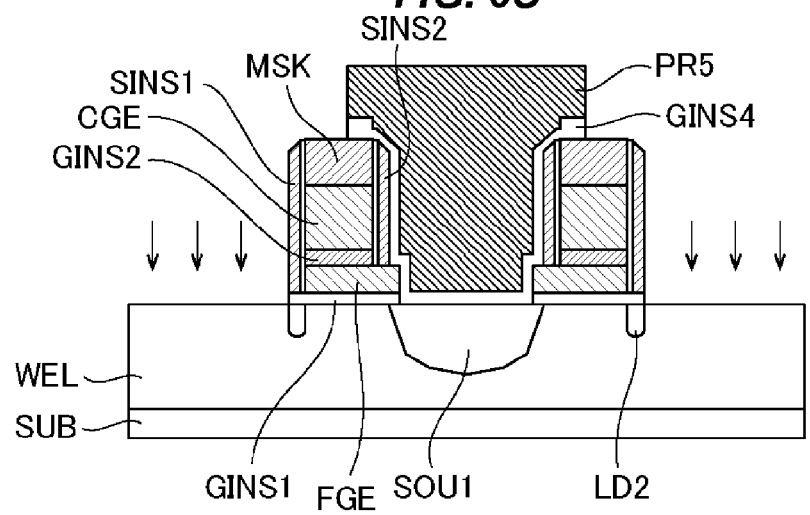

Then, as illustrated in FIG. 6C, a p-type impurity is implanted from the vertical direction with the resist pattern PR5 as a mask. Therefore, a p-type impurity is implanted into regions except the portion located below the spacer insulating film SINS1 of the second low-concentration region LD2. Accordingly, the regions except the portion located below the spacer insulating film SINS1 of the second low-concentration region LD2 substantially disappear.

Figure 7A:
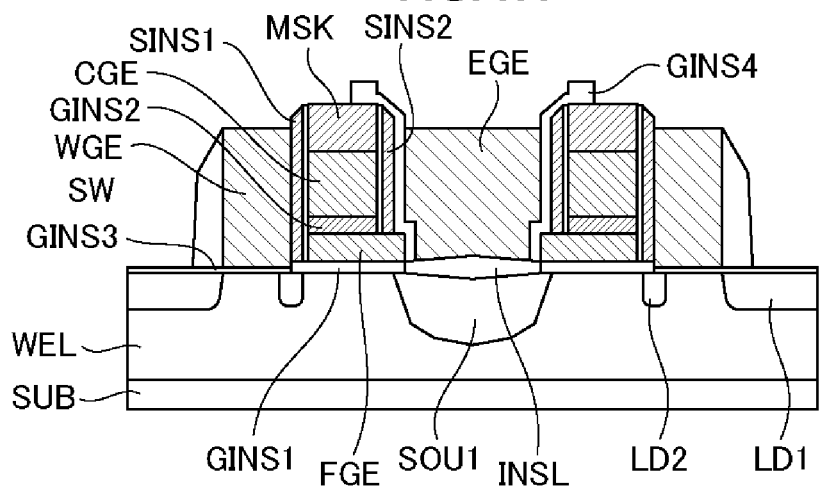
FIGS. 7A-7B are cross-sectional views illustrating an example of the method of manufacturing the semiconductor device illustrated in FIG. 1.

Next, as illustrated in FIG. 7A, the resist pattern PR5 is removed. Subsequently, the insulating film GINS3 is formed in the substrate SUB on the drain side by thermal oxidation. Here, since the substrate SUB on the source side is also oxidized at the same time, the insulating film INSL is formed due to the increase in the film thickness of the remaining insulating film GINS4. Then, a conductive film (for example, polysilicon film) is formed over the substrate SUB by a plasma CVD method. After that, a resist pattern (not illustrated) exposing a memory cell is formed over this conductive film, and anisotropic dry etching is performed with respect to this conductive film. Therefore, inside the memory cell, the erase gate electrode EGE and the selection gate electrode WGE are formed in a self-aligned manner.

Next, with the erase gate electrode EGE, the mask film MSK, and the selection gate electrode WGE as a mask, an n-type impurity is ion-implanted into the substrate SUB. Therefore, the first low-concentration region LD1 is formed on the substrate SUB. Subsequently, an insulating film (for example, silicon oxide film) is formed over the substrate SUB by using a plasma CVD method, and this insulating film is etched back. Therefore, the side wall insulating film SW is formed. Meanwhile, the side wall insulating film SW may be a stacked film of a silicon oxide film and a silicon nitride film.

Figure 7B:
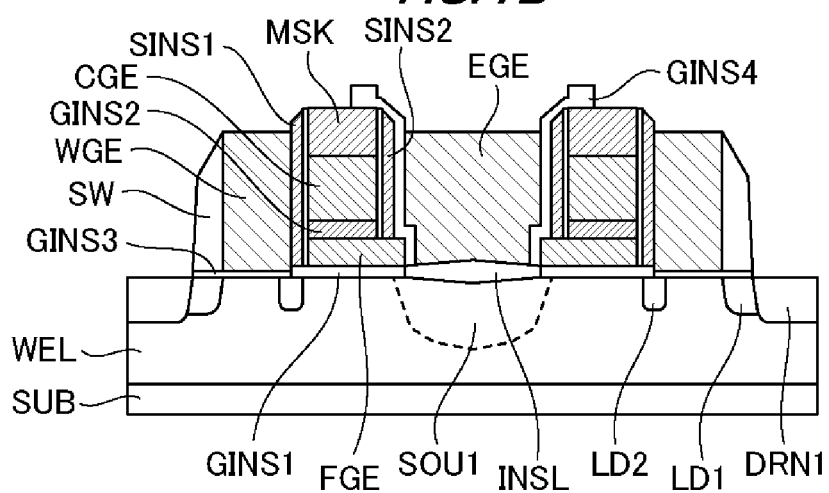

Then, as illustrated in FIG. 7B, with the erase gate electrode EGE, the mask film MSK, the selection gate electrode WGE, and the side wall insulating film SW as a mask, an n-type impurity is ion-implanted into the substrate SUB. Therefore, the drain DRN1 is formed. In this manner, the semiconductor device SD illustrated in FIG. 1 is formed.

Figure 8:
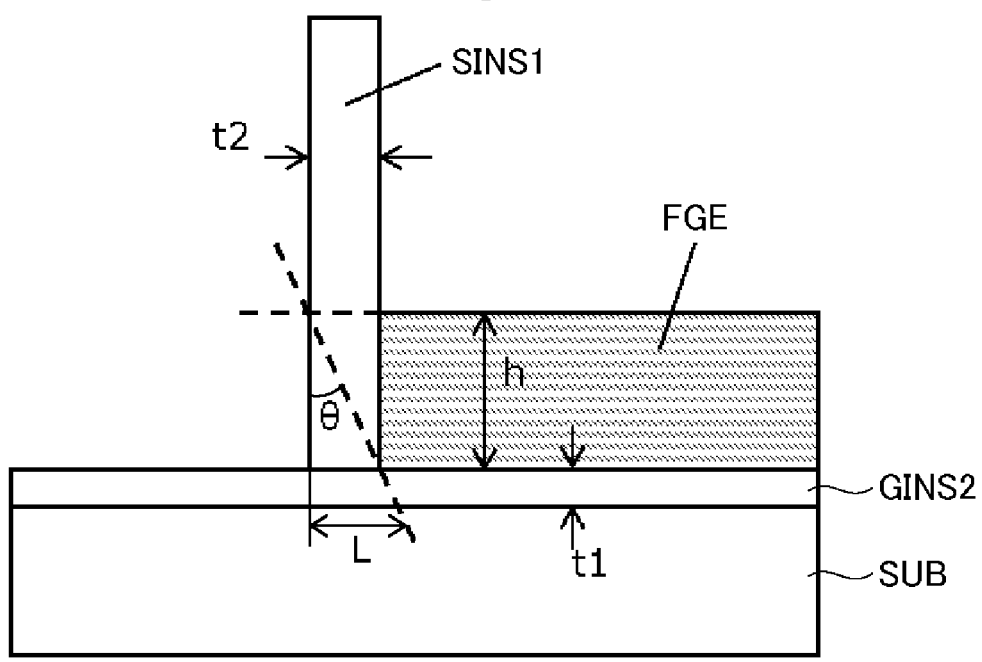
FIG. 8 illustrates conditions of ion implantation when a second low-concentration region is formed.

FIG. 8 illustrates the conditions of ion implantation when the second low-concentration region LD2 is formed. The height of the floating gate electrode FGE is designated by h, the thickness of the insulating film GINS1 is designated by t1, and the thickness of the spacer insulating film SINS1 is designated by t2. In order to implant ions into a portion below the spacer insulating film SINS1 and in order not to ion-implant into a portion below the floating gate electrode FGE as much as possible, the angle θ of ion implantation is preferably set to Formula below.

$$\tan \theta = t2/h \quad (1)$$

Furthermore, with regard to the implantation energy in ion implantation, if in a dopant to be used, the range at a certain energy is set to Rp and the standard deviation of the range is set to σ, then Formula (2) below is established.

$$\text{Implantation width } L = (h+t1)/\cos \theta = Rp + 3\sigma \quad (2)$$

Since this relationship is satisfied, the existence range of the low concentration region by effectively-diagonally implanted dopant is limited to a portion below the spacer insulating film SINS1 with considerable accuracy.

For example, assume that the p-type impurity of the well WEL is B, that the n-type impurity when the spacer insulating film SINS1 is formed is As, and that t1=10 nm and t2=30 nm are established. In this case, when h=300 nm holds, then θ=5.7° and L=312 nm are established, and a preferable ion implantation energy of As is 280 keV, and when h=200 nm holds, then θ=8.5° and L=212 nm are established, and a preferable ion implantation energy of As is 190 keV. Furthermore, when h=100 nm holds, then θ=16.7° and L=115 nm are established, and a preferable ion implantation energy of As is 100 keV, and when h=50 nm holds, then θ=31.0° and L=70 nm are established, and a preferable ion implantation energy of As is 50 keV.

Figure 9:
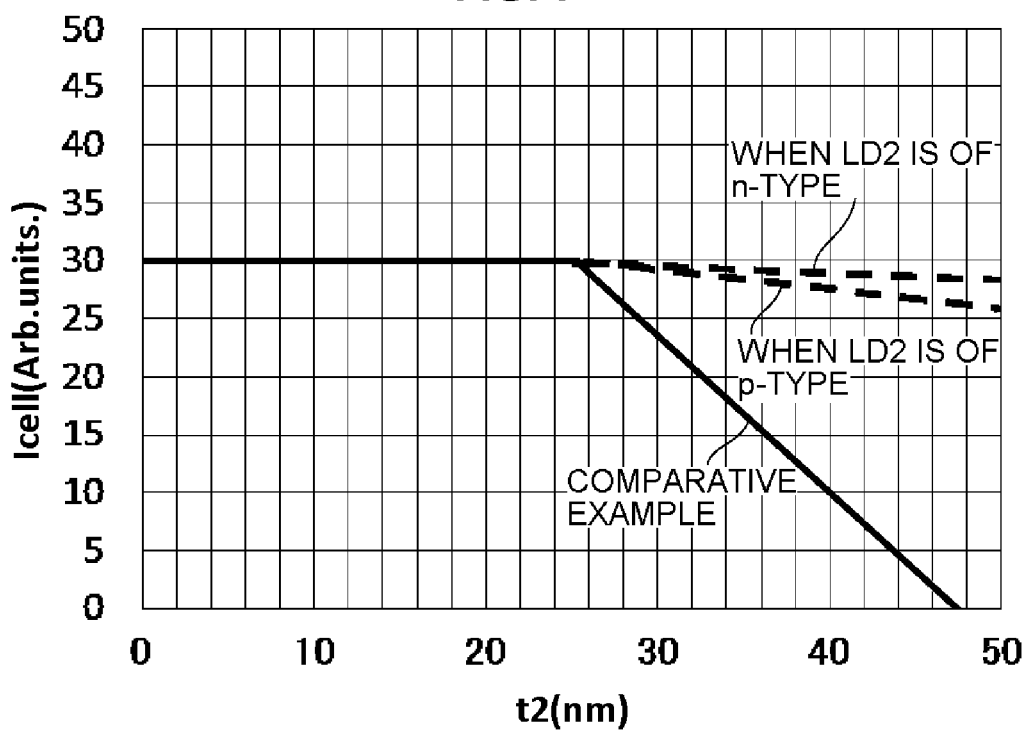
FIG. 9 illustrates a relationship between the thickness of a spacer insulating film and an on-current between a drain and a source.

FIG. 9 illustrates a relationship between the thickness of the spacer insulating film SINS1 and the on-current between the drain DRN1 and the source SOU1. Specifically, FIG. 9 illustrates a case where the second low-concentration region LD2 is not formed (comparative example), a case where the n-type impurity concentration in the second low-concentration region LD2 is lower than the p-type impurity concentration (when the second low-concentration region LD2 is a p-type), and a case where the n-type impurity concentration in the second low-concentration region LD2 is higher than the p-type impurity concentration (when the second low-concentration region LD2 is an n-type).

In the comparative example, as the thickness of the second low-concentration region LD2 increases, an inversion layer becomes unlikely to be formed in a portion located below the second low-concentration region LD2 of the substrate SUB. Accordingly, when the thickness of the second low-concentration region LD2 becomes equal to or greater than a certain value, the on-current abruptly decreases. In this case, incorrect information might be read from the memory cell.

In contrast to this, according to the above-described embodiment, in a portion located below the spacer insulating film SINS1 of the substrate SUB, the second low-concentration region LD2 is formed. An n-type impurity is already implanted into the second low-concentration region LD2. Therefore, the effective p-type impurity concentration in the second low-concentration region LD2 is lower than the effective p-type impurity concentration in the well WEL. Accordingly, the spacer insulating film SINS1 becomes thicker than a design value, and even if the distance between the selection gate electrode WGE and the control gate electrode CGE increases, the on-resistance of a portion located between the selection gate electrode WGE and the control gate electrode CGE of the substrate SUB decreases. As a result, even if the distance between the selection gate electrode WGE and the control gate electrode CGE is large, a current flows from the drain to the source when a voltage is applied to each of the selection gate electrode WGE and the control gate electrode CGE. Therefore, the reading of incorrect information from the memory cell can be suppressed.

Furthermore, in the second low-concentration region LD2, when the n-type impurity concentration is lower than the p-type impurity concentration, the second low-concentration region LD2 remains the p type region, and thus the write characteristics of the nonvolatile memory are not degraded.

On the other hand, in the second low-concentration region LD2, when the n-type impurity concentration is higher than the p-type impurity concentration, the second low-concentration region LD2 serves as an n-type region. Therefore, as illustrated in FIG. 9, when the distance between the selection gate electrode WGE and the control gate electrode CGE is large, the current more easily flow from the drain to the source when a voltage is applied to the selection gate electrode WGE and the control gate electrode CGE, respectively. Therefore, the reading of incorrect information from the memory cell can be further suppressed.

Second Embodiment

FIG. 10 is a cross-sectional view for explaining a method of manufacturing the semiconductor device SD according to a second embodiment. The method of manufacturing the semiconductor device SD according to the present embodiment is the same as the method of manufacturing the semiconductor device SD according to the first embodiment except the timing of forming the second low-concentration region LD2.

Figure 10A:
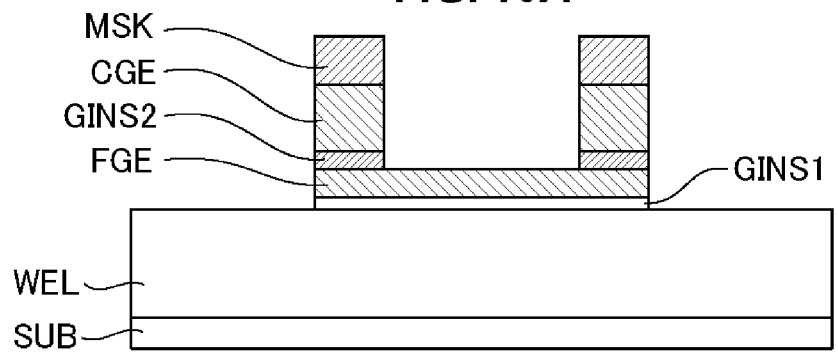
FIGS. 10A-10C are cross-sectional views for explaining a method of manufacturing a semiconductor device according to a second embodiment.

Specifically, as illustrated in FIG. 10A, first, the well WEL is formed in the substrate SUB, and furthermore the insulating film GINS1, the floating gate electrode FGE, and the insulating film GINS2, the control gate electrode CGE, and the mask film MSK are formed. This process is as illustrated in FIGS. 4A and 4B in the first embodiment.

Figure 10B:
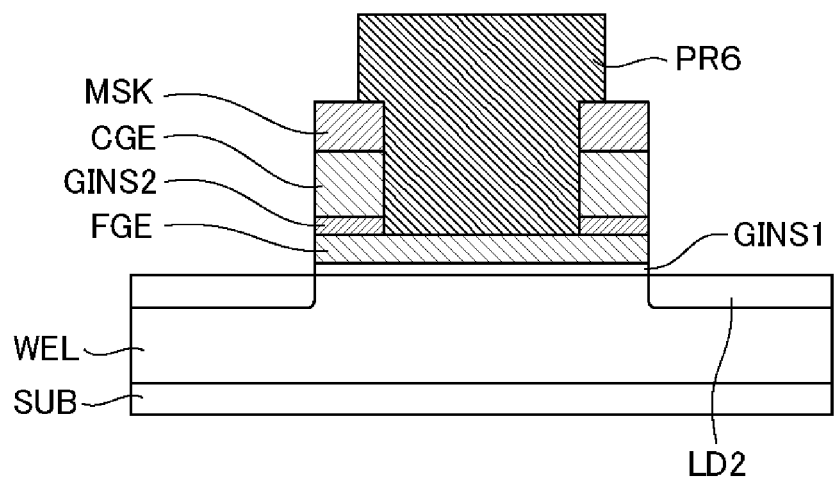

Next, as illustrated in FIG. 10B, a resist pattern PR6 is formed. The pattern shape of the resist pattern PR6 is the same as the pattern shape of the resist pattern PR5. Subsequently, with the resist pattern PR6 as a mask, an n-type impurity ion is implanted from a direction perpendicular to the substrate SUB. Therefore, the second low-concentration region LD2 is formed.

Figure 10C:
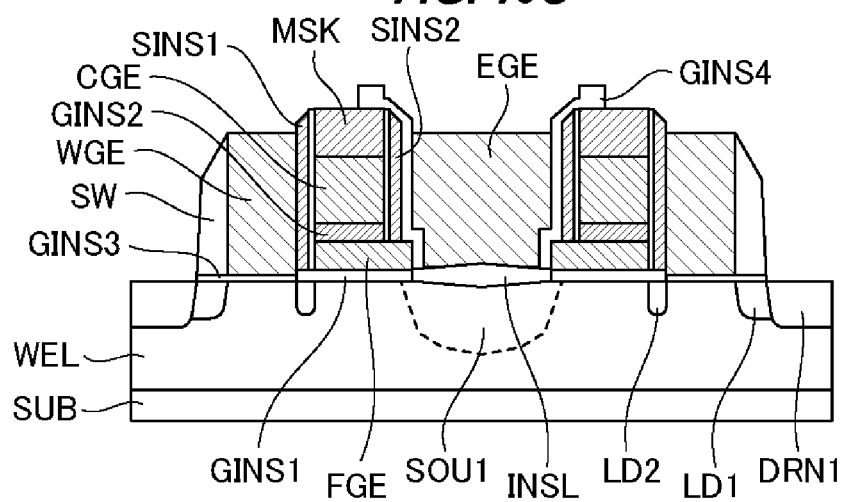

Subsequently, the resist pattern PR6 is removed. The subsequent processes are as described using FIG. 4C to FIG. 7B in the first embodiment, except that the second low-concentration region LD2 is not formed at the timing illustrated in FIG. 6B (FIG. 10C).

Also with the present embodiment, the same effect as the first embodiment is obtained.

Third Embodiment

FIG. 11 to FIG. 14 are the cross-sectional views illustrating a method of manufacturing the semiconductor device SD according to a third embodiment. The semiconductor device SD manufactured according to the present embodiment includes a memory region FMR and a logic region LGCR. In the memory region FMR, the memory illustrated in the first embodiment is formed in a plurality of numbers. On the other hand, in the logic region LGCR, at least one logic circuit is formed. This logic circuit includes a transistor. Furthermore, the semiconductor device SD also includes a transistor having a higher breakdown voltage than the transistor. This transistor has a gate insulating film thicker than the transistor of the logic circuit.

Figure 11A:
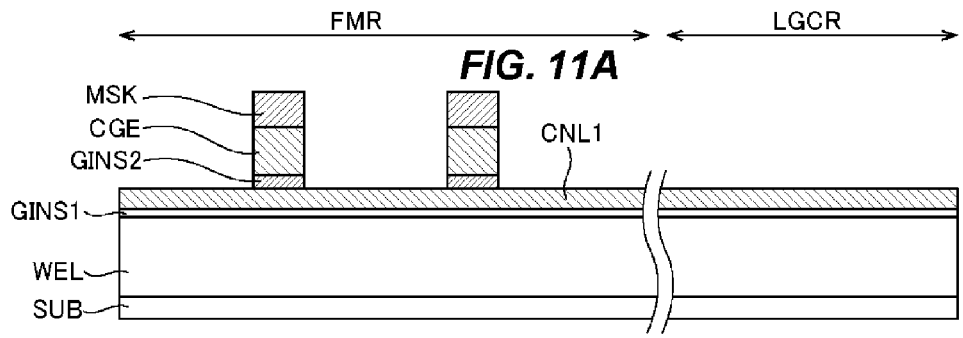
FIGS. 11A-11D are cross-sectional views illustrating a method of manufacturing a semiconductor device according to a third embodiment.

First, as illustrated in FIG. 11A, the well WEL is formed in the substrate SUB. The well WEL is formed both in the memory region FMR and in the logic region LGCR. Next, the insulating film GINS1, the conductive film CNL1, the insulating film GINS2, the control gate electrode CGE, and the mask film MSK are formed in the memory region FMR. The method of forming these elements is the same as the method of the first embodiment. In this process, the insulating film GINS1 and the conductive film CNL1 are formed also in the logic region LGCR.

Figure 11B:
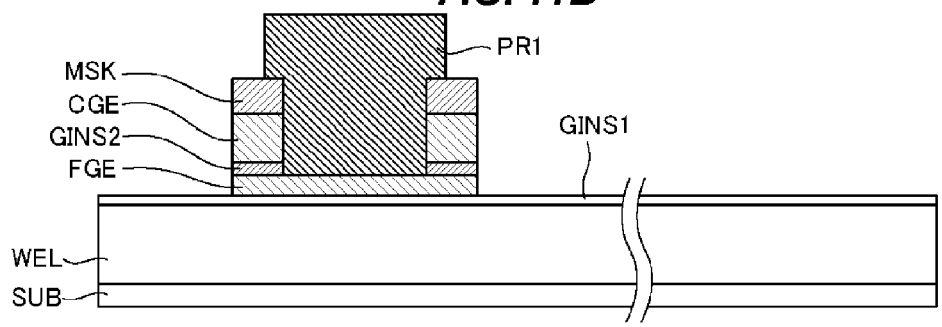

Subsequently, as illustrated in FIG. 11B, the resist pattern PR1 is formed and the etching with the resist pattern PR1 as a mask is performed. Therefore, the floating gate electrode FGE is formed. In addition, in this process, the conductive film CNL1 located in the logic region LGCR is removed.

Figure 11C:
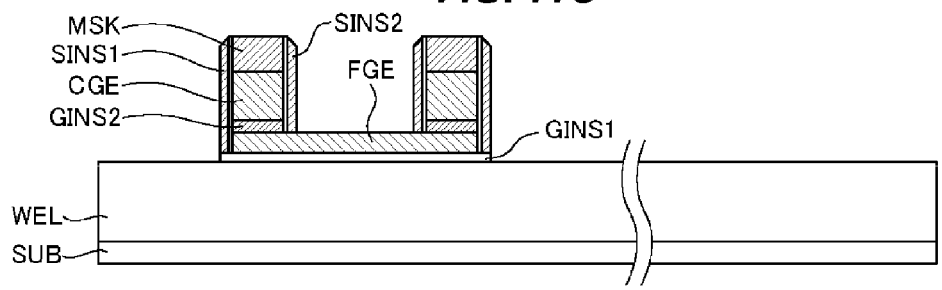

Then, as illustrated in FIG. 11C, the spacer insulating films SINS1 and SINS2 are formed. The method of forming these is the same as the method of the first embodiment. Meanwhile, in this process, a portion not covered with the floating gate electrode FGE or spacer insulating film SINS1 of the insulating film GINS1 is removed.

Figure 11D:
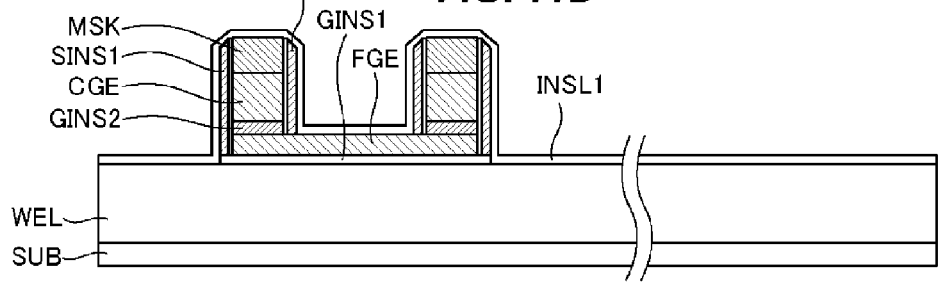

After that, as illustrated in FIG. 11D, the insulating film INSL1 is formed. The insulating film INSL1 is formed also over the substrate SUB located in the logic region LGCR.

Next, as illustrated in FIG. 12A, the resist pattern PR2 is formed. The resist pattern PR2 also covers the substrate SUB located in the logic region LGCR. Then, with the resist pattern PR2 and the insulating film INSL1 as a mask, the floating gate electrode FGE and the insulating film GINS1 are etched. Therefore, a portion located in a region, in which the source SOU1 is to be formed, of the floating gate electrode FGE and the insulating film GINS1 is removed.

Subsequently, as illustrated in FIG. 12B, the resist pattern PR2 is removed. After that, a gate insulating film GINS5 of the high voltage transistor is formed using a deposition method such as a plasma CVD method or a CVD method. In this process, the gate insulating film GINS5 is formed over the substrate SUB located in the memory region FMR, over the spacer insulating films SINS1 and SINS2, over the mask film MSK, and also over an exposed portion of the side surfaces of the floating gate electrode FGE. Furthermore, the gate insulating film GINS5 is formed also over the substrate SUB located in the logic region LGCR.

After that, as illustrated in FIG. 12C, the resist pattern PR3 is formed. The resist pattern PR3 also covers the substrate SUB located in the logic region LGCR. Next, an n-type impurity ion is implanted into the substrate SUB with the resist pattern PR3 as a mask. Therefore, the source SOU1 is formed in the substrate SUB. Furthermore, with the resist pattern PR3 as a mask, etching is performed. Accordingly, portions not covered with the resist pattern PR3 of the gate insulating film GINS5 (for example, a portion located over the source SOU1, a portion located over one of the side surfaces of the floating gate electrode FGE, and a portion located over the spacer insulating film SINS2) are removed.

Subsequently, as illustrated in FIG. 12D, the resist pattern PR3 is removed. Then, the insulating film GINS4 is formed as the tunnel insulating film. The insulating film GINS4 is formed by, for example, a CVD method. Meanwhile, the insulating film GINS4 is formed also on the drain side of the memory region FMR and over the insulating film GINS5 of the logic region LGCR, but here for simplification, in FIG. 12D, the tunnel insulating film GINS4 over the gate insulating film GINS5 is illustrated integrally with the insulating film GINS5.

Figure 13A:
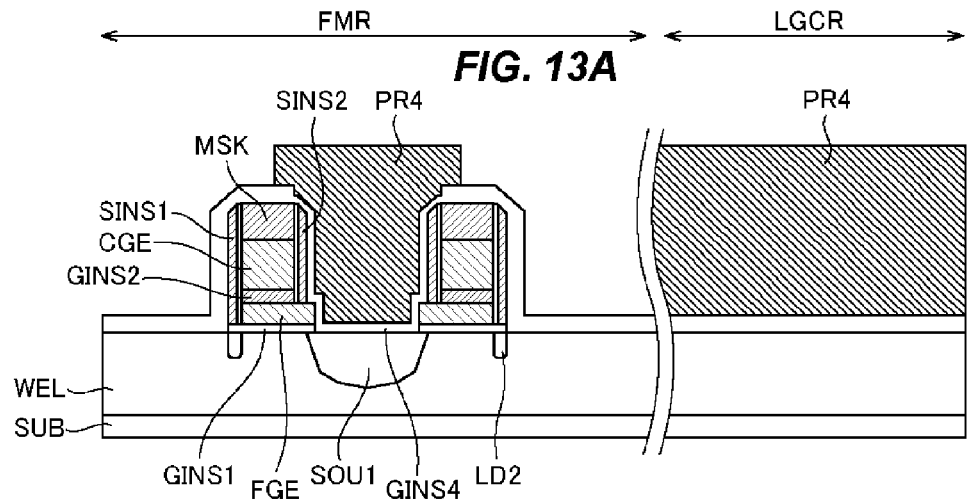
FIGS. 13A-13C are cross-sectional views illustrating the method of manufacturing the semiconductor device according to the third embodiment.

After that, as illustrated in FIG. 13A, the resist pattern PR4 is formed. The resist pattern PR4 also covers the substrate SUB located in the logic region LGCR. Next, ion implantation with the resist pattern PR4 as a mask is performed to thereby form the second low-concentration region LD2. This process is as described using FIGS. 6A and 6B in the first embodiment.

Figure 13B:
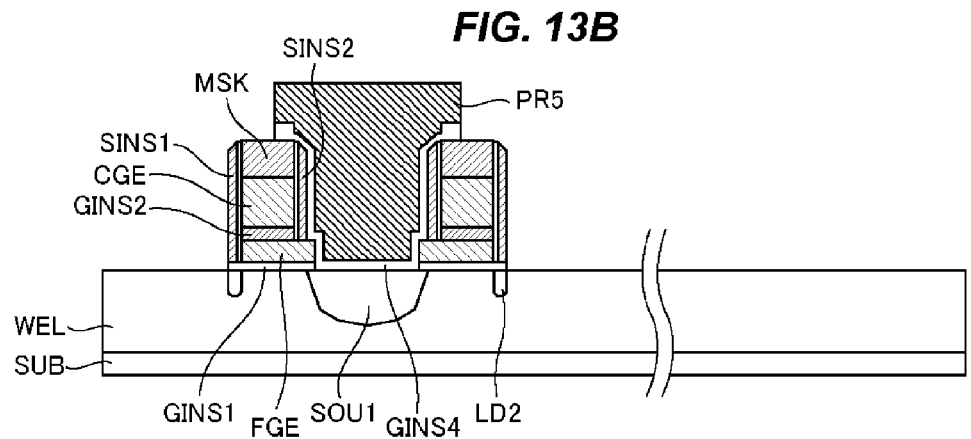

Subsequently, as illustrated in FIG. 13B, the resist pattern PR5 is formed, and etching with the resist pattern PR5 as a mask is performed to thereby remove the unnecessary portions of the insulating film GINS4 and the gate insulating film GINS5. This process is as described using FIG. 6A in the first embodiment.

Figure 13C:
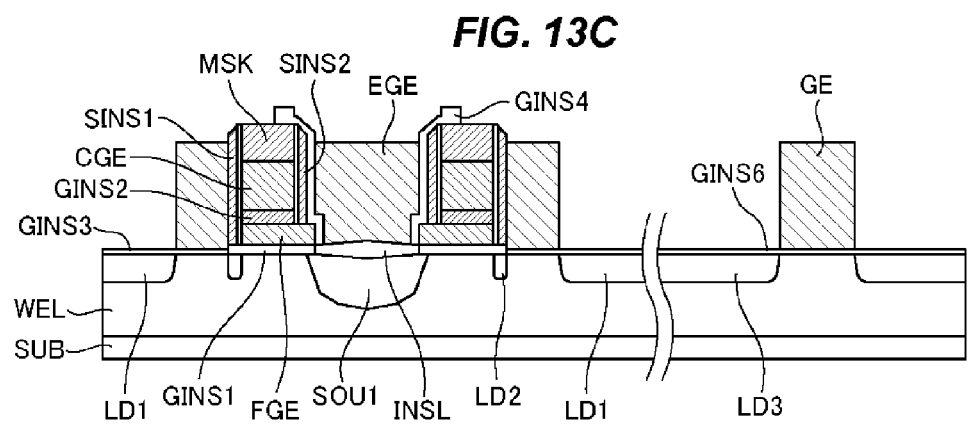

Then, as illustrated in FIG. 13C, the resist pattern PR5 is removed. After that, the insulating film GINS3 is formed on the substrate SUB on the drain side by thermal oxidation. Here, since the substrate SUB on the source side is also oxidized at the same time, the insulating film INSL is formed due to an increase in the film thickness of the remaining insulating film GINS4. Furthermore, at this time, in the logic region LGCR, a gate insulating film GINS6 serving as a gate insulating film of the transistor is formed.

Next, a conductive film such as a polysilicon film is formed over the substrate SUB. Although not illustrated, through the use of a resist pattern exposing the memory region FMR and covering a part of the logic region LGCR, the conductive film is processed by anisotropic dry etching. Therefore, the erase gate electrode EGE and the selection gate electrode WGE are formed. This process is as described using FIG. 7A in the first embodiment. Meanwhile, in this process, a gate electrode GE of the transistor is formed in the logic region LGCR.

Figure 14A:
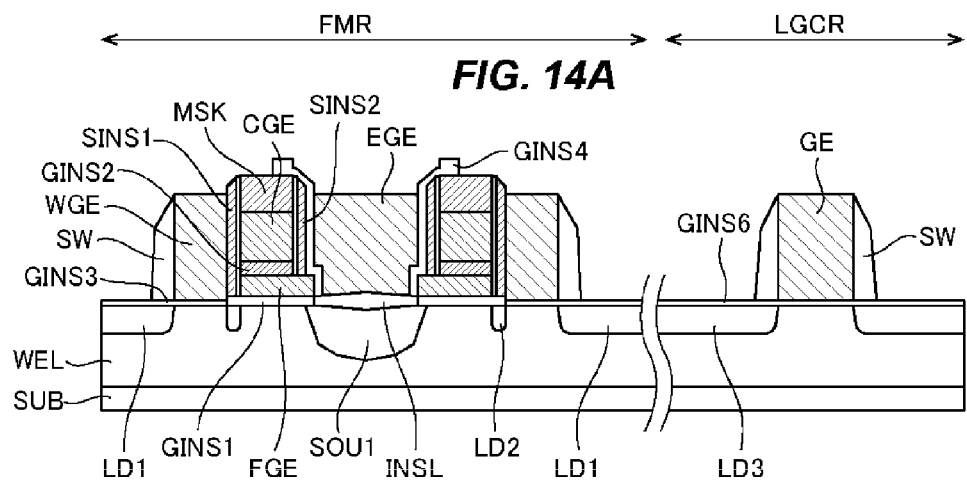
FIGS. 14A-14B are cross-sectional views illustrating the method of manufacturing the semiconductor device according to the third embodiment.

Next, as illustrated in FIG. 14A, the first low-concentration region LD1 and the side wall insulating film SW are formed. This process is as described using FIG. 7A in the first embodiment. Furthermore, in this process, a low concentration region LD3 of the transistor is formed in the logic region LGCR, and the side wall insulating film SW is formed in the side wall of the gate electrode GE.

Figure 14B:
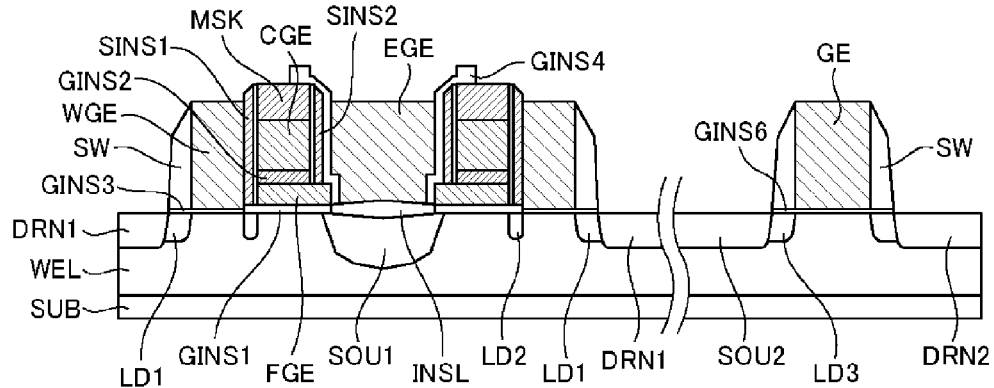

Then, as illustrated in FIG. 14B, the drain DRN1 is formed in the memory region FMR. This process is as described using FIG. 7B in the first embodiment. Furthermore, in this process, the drain DRN2 and the source SOU2 of the transistor are formed in the logic region LGCR.

Also through the use of the present embodiment, the same effect as the first embodiment is obtained. Meanwhile, in the present embodiment, the second low-concentration region LD2 may be formed in a manner similar to the second embodiment.

The present invention made by the present inventor has been described specifically on the basis of the embodiments. However, it is needless to say that the present invention is not limited to the embodiments, but various modifications are possible within the scope not departing from the gist of the invention.

What is claimed is:
1. A semiconductor device comprising:
a substrate;
a first conductivity-type well formed on the substrate;
a first insulating film formed in a region, in which the well is formed, of the substrate;

a floating gate electrode formed over the first insulating film;

a spacer insulating film covering a first side wall of the floating gate electrode;

a selection gate electrode that faces the floating gate electrode via the spacer insulating film;

a side wall insulating film formed in a side surface opposite to the spacer insulating film of the selection gate electrode;

a first second-conductivity-type region formed in the well and located on a side opposite to the floating gate electrode via the side wall insulating film in a planar view;

a second second-conductivity-type region formed in the well and located on a side opposite to the first second-conductivity-type region via the floating gate electrode in a planar view;

a first low-concentration region formed in the well and located under the side wall insulating film in a planar view, the first low-concentration region having a second conductivity-type impurity concentration lower than the first second-conductivity-type region; and a second low-concentration region formed in the well and located under the spacer insulating film in a planar view, wherein the second conductivity-type impurity concentration in the second low-concentration region is lower than the second conductivity-type impurity concentration in the first low-concentration region and is higher than the second conductivity-type impurity concentration in a portion located under the first insulating film of the well.

2. The semiconductor device according to claim 1, wherein in the second low-concentration region, the second conductivity-type impurity concentration is lower than the first conductivity-type impurity concentration.

3. The semiconductor device according to claim 1, wherein in the second low-concentration region, the second conductivity-type impurity concentration is higher than the first conductivity-type impurity concentration.

4. The semiconductor device according to claim 1, wherein the first low-concentration region further includes a first conductivity-type impurity concentration higher than a first conductivity-type impurity concentration in the well.

5. The semiconductor device according to claim 1, wherein the second low-concentration region is formed between a region of the well directly below the floating gate and the first low-concentration region.

6. A method of a manufacturing semiconductor device, comprising:

forming a first conductivity-type well on a substrate;

forming a first insulating film and a floating gate electrode located over the first insulating film in a region, in which the well is formed, of the substrate;

forming a spacer insulating film covering a first side wall of the floating gate electrode;

forming a low concentration region in a region not covered with the floating gate electrode of the well and in a region located below the spacer insulating film by implanting a second conductivity-type impurity ion into the well from a diagonal direction;

implanting a first conductivity-type impurity ion into a region not covered with the spacer insulating film of the low concentration region;

forming a selection gate electrode that faces the floating gate electrode via the spacer insulating film; and forming, in the well, a first second-conductivity-type region and a second second-conductivity-type region being located opposite to each other via the selection gate electrode and the floating gate electrode in a planar view.

7. The method according to claim 6, wherein the first conductivity-type impurity ion is implanted after the low concentration region is formed.

8. The method according to claim 6, wherein the first conductivity-type impurity ion is implanted only into the region not covered with the spacer insulating film of the low concentration region.

9. A method of a manufacturing semiconductor device, comprising:

forming a first conductivity-type well on a substrate;

forming a first insulating film and a floating gate electrode located over the first insulating film in a region, in which the well is formed, of the substrate;

forming a low concentration region in a region not covered with the floating gate electrode of the wells by implanting a second conductivity-type impurity ion into the well;

forming a spacer insulating film covering a first side wall of the floating gate electrode;

implanting a first conductivity-type impurity ion into a region not covered with the spacer insulating film of the low concentration region;

forming a selection gate electrode that faces the floating gate electrode via the spacer insulating film; and forming, in the well, a first second-conductivity-type region and a second second-conductivity-type region being located opposite to each other via the selection gate electrode and the floating gate electrode in a planar view.

10. The method according to claim 9, wherein the first conductivity-type impurity ion is implanted after the low concentration region is formed.

11. The method according to claim 9, wherein the first conductivity-type impurity ion is implanted only into the region not covered with the spacer insulating film of the low concentration region.

* * * * *